US008464190B2

(12) United States Patent
Bower et al.

(10) Patent No.: US 8,464,190 B2
(45) Date of Patent: Jun. 11, 2013

(54) METHOD OF, AND APPARATUS FOR, STREAM SCHEDULING IN PARALLEL PIPELINED HARDWARE

(75) Inventors: Jacob Alexis Bower, London (GB); James Huggett, London (GB); Oliver Pell, London (GB)

(73) Assignee: Maxeler Technologies Ltd., London (GB)

( * ) Notice: Subject to any disclaimer, the term of this patent is extended or adjusted under 35 U.S.C. 154(b) by 0 days.

(21) Appl. No.: 13/029,696

(22) Filed: Feb. 17, 2011

(65) Prior Publication Data
US 2012/0216019 A1 Aug. 23, 2012

(51) Int. Cl.
*G06F 17/50* (2006.01)
*G06F 9/455* (2006.01)

(52) U.S. Cl.
USPC .......................... 716/106; 716/110; 716/121

(58) Field of Classification Search
USPC ........................ 716/110, 116, 121
See application file for complete search history.

(56) References Cited

U.S. PATENT DOCUMENTS

| | | | |
|---|---|---|---|
| 7,305,649 B2 | 12/2007 | Bellas et al. | |
| 7,817,655 B1 | 10/2010 | Bennet et al. | |
| 2002/0162097 A1* | 10/2002 | Meribout | 717/155 |
| 2004/0003376 A1 | 1/2004 | May et al. | |
| 2005/0283774 A1 | 12/2005 | Eichenberger et al. | |
| 2006/0242617 A1 | 10/2006 | Bellas et al. | |
| 2008/0162884 A1* | 7/2008 | Kailas et al. | 712/214 |
| 2008/0222623 A1 | 9/2008 | Eichenberger et al. | |

FOREIGN PATENT DOCUMENTS

WO 2007046749 A2 4/2007

OTHER PUBLICATIONS

European Application No. EP 11 19 5864 Search Report dated Jun. 14, 2012, (7 pages).
Javaid, H. et al., "Optimal Synthesis of Latency and Throughput Constrained Pipelined MPSoCs Targeting Streaming Applications", Hardware/Software Codesign and System Synthesis (CODES+ISSS), 2010 IEEE/ACM/IFIP International Conference, Oct. 24-29, 2010, pp. 75-84.
Zhu, J. et al., "Buffer Minimization of Real-Time Streaming Applications Scheduling on Hybrid CPU/FPGA Architectures", Design, Automation and Test in Europe Conference and Exhibition, IEEE, Piscataway, NJ, USA, Apr. 20, 2009, pp. 1506-1511.
Wang, Y. et al., "Memory-Aware Optimal Scheduling with Communication Overhead Minimization for Streaming Applications on Chip Multiprocessors", 31st IEEE Real-Time Systems Symposium, Nov. 30, 2010, pp. 350-359.
Yang, H. et al., "Pipelined Data Parallel Task Mapping/Scheduling Technique for MPSoC", DESIGN, Design, Automation and Test in Europe Conference and Exhibition, IEEE, Piscataway NJ, USA, Apr. 20, 2009, pp. 69-74.
Desouza-Batista, J. C., et al., "Optimal Synthesis of Application Specific Heterogeneous Pipelined Multiprocessors", International Conference on Application Specific Array Processors, Proceedings, International Conference on San Francisco, CA. USA, Los Alamitos, CA. USA, IEEE Computer Society, Aug. 22-24, 1994, pp. 99-110.
Search Report for U.K. Application No. GB 1122363.3 dated Jun. 25, 2012, (4 pages).
EP11195864 European Search Report dated Nov. 2, 2012 (6 pgs.).

(Continued)

*Primary Examiner* — Suresh Memula
(74) *Attorney, Agent, or Firm* — Conley Rose, P.C.

(57) ABSTRACT

There is provided embodiment of methods of and apparatus for generating a hardware design for a pipelined parallel stream processor.

26 Claims, 12 Drawing Sheets

OTHER PUBLICATIONS

GB1122363.3 Search Report dated Nov. 29, 2012 (3 pgs).
S. Ciricescu et al., The Reconfigurable Streaming Vector Processor (RSVP), Proc. IEEE/ACM International Symposium on Microarchitecture, Dec. 3-5, 2003, pp. 141-150; XP010674587.

Nelson Luiz Passos et al., Scheduling of Uniform Multidimensional Systems Under Resource Constraints, IEEE Transactions on Very Large Scale Integrated (VLSI) Systems, IEE Service Center, Piscataway, NJ, USA, vol. 6, No. 4, Dec. 1, 1998; XP011063390.

* cited by examiner

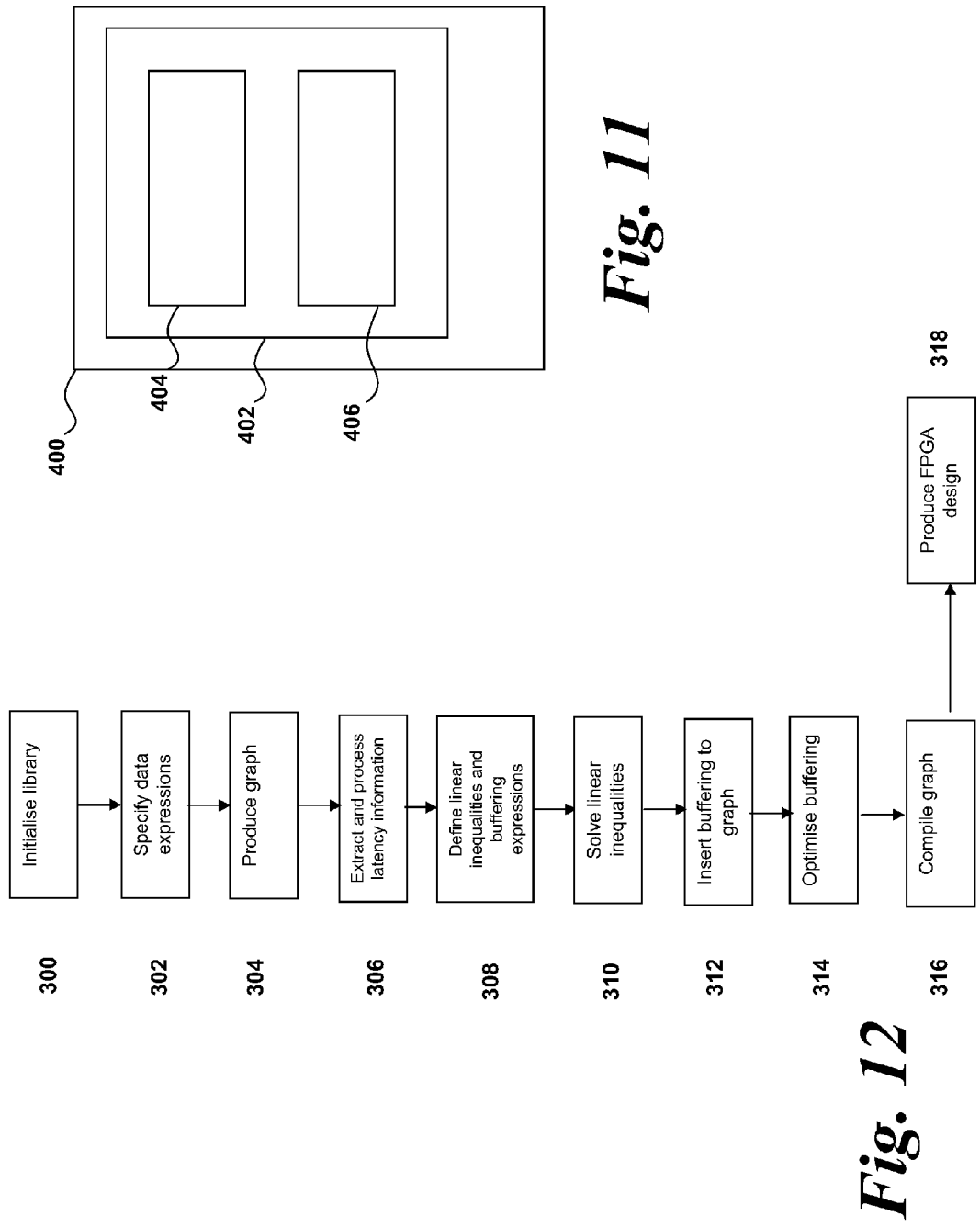

METHOD OF, AND APPARATUS FOR, STREAM SCHEDULING IN PARALLEL PIPELINED HARDWARE

STATEMENT REGARDING FEDERALLY SPONSORED RESEARCH OR DEVELOPMENT

Not applicable.

BACKGROUND OF THE INVENTION

1. Field of Invention

The invention relates generally to a method of, and apparatus for, stream scheduling in pipelined hardware. More particularly, the invention relates to a method of, and apparatus for, generating a hardware design for a pipelined parallel stream processor.

2. Background of Technology

Computer systems are often used to implement computational models of a particular physical system, region or event. Commonly, such computational models require iterative numerical calculations to be solved for a large number of data areas or data points. This requires an extremely large number of calculations to be performed; consuming large amounts of computational resources and requiring a significant time period to perform complete the necessary calculations.

Often, a processor such as a central processing unit (CPU) is found in most computing systems. However, whilst a CPU is able to process such calculations, the time period required may be prohibitive unless powerful computing systems are used.

Traditionally, the performance of a computing system has been increased by increasing the operating frequency of the CPU (i.e. by increasing the number of operations the CPU can carry out per second) and by reducing the size of the individual transistors on the CPU so that more transistors can be accommodated per unit area. However, due to power constraints, in the future increasing the CPU frequency may only deliver modest performance improvements. Further, it is becoming increasingly difficult to reduce the size of transistors due to the limitations of lithographic processes and material capabilities.

An alternative approach to increase the speed of a computer system for specialist computing applications is to use additional or specialist hardware accelerators. These hardware accelerators increase the computing power available and concomitantly reduce the time required to perform the calculations. In certain cases, a specialist hardware accelerator may increase the performance of highly parallel applications by over an order of magnitude or more.

One such example of a suitable system is a stream processing accelerator having a dedicated local memory. The accelerator may be located on an add-in card which is connected to the computer via a bus such as Peripheral Component Interconnect Express (PCI-E). The bulk of the numerical calculations can then be handled by the specialised accelerator.

A useful type of stream processor accelerator can be implemented using Field-Programmable Gate Arrays (FPGAs). FPGAs are reprogrammable hardware chips which can implement digital logic. FPGAs comprise no intrinsic functionality and, instead, include a plurality of gates, flip-flops and memory elements which are configurable through use of appropriate software elements.

BRIEF SUMMARY OF THE PREFERRED EMBODIMENTS

A schematic example of an FPGA device is shown in FIG. 1. Different types of FPGA chips may be used; however the larger and more arithmetic function-rich FPGAs are more desirable.

The FPGA 10 comprises a programmable semiconductor device which comprises a matrix of configurable logic blocks (CLBs) 12 connected via programmable reconfigurable interconnects 14 (shown here as the shaded area in FIG. 1). In order to get data into and out of the FPGA 10, a plurality of input pads 16 and output pads 18 are provided.

The CLBs 12 are the basic logic unit of the FPGA 10. A schematic diagram of a typical CLB 12 is shown in FIG. 2. The CLB 12 comprises a configurable switch matrix comprising typically a 4 or 6 input look up table (LUT) 20, which in some cases may also be configurable as a small buffer of up to about 32 bits, some specialist circuitry (such as, for example, a multiplexer), one or more flip-flop units 22 which act as temporary memory storage and an output 24. Additionally, an FPGA 10 comprises a plurality of block memory units 26. The block memory units 26 comprise addressable memory units which can be used as storage buffers in the FPGA 10. A fixed amount of buffer space is available per FPGA 10. Therefore, it must be carefully allocated.

The LUTs 20 of each CLB 12 can be configured to perform a variety of functions; for example, logic gates such as NAND and XOR, or more complex functions. A typical FPGA may comprise up to $10^5$ LUTs 20. The CLBs 12 are able to operate in parallel, providing a powerful resource for numerically-intense calculations.

FPGA-based stream processors comprise calculation functions mapped into one or more hardware units along the path from input to output. The FPGA then performs the computation by streaming the data items through the hardware units. Each hardware unit will require a particular time period within which to complete the necessary computation. This is known as the latency of the hardware unit and is commonly defined in terms of the number of clock cycles the hardware unit requires to complete the computation. Once the computation is complete, the data then moves "downstream" to further hardware units or to an output. The streaming architecture makes efficient utilization of the computation device, as every part of the circuit is performing an operation on one corresponding data item in the data stream at any point during the calculation.

FIG. 3 shows an example of such a streaming architecture created using the CLBs 12 of the FPGA to implement a stream processor thereon. FIG. 3 shows a 4 input 16-$i$, 4 output 18-$i$ stream computing engine which can be implemented on the FPGA stream processor 10.

Between the inputs 16-$i$ and the outputs 18-$i$ is provided a computational data path 30. The computational data path 30 is a graphical representation of an algorithm as it is expressed in hardware. The computational data path 30 is also referred to as a kernel. A typical FPGA 10 may comprise a multiplicity of parallel kernels.

The computational data path 30 is implemented using the CLBs 12 and other logic and comprises arithmetic operations 32 (performed in one or more LUTs 20) and buffer memories 26. In other words, each arithmetic unit 32 is implemented in hardware as a hardware element (which may comprise one or more hardware units) on the FPGA. The buffer memories 26 may comprise either block RAM (as provided by the block memory units 26) or distributed RAM (comprising the memory made available through use of the LUTs 20 or flip flops 22). As shown, the computational data path 30 is arranged to process data in parallel.

In operation, the data is streamed through the CLBs 12 of the FPGA stream processor 10 and the arithmetic operations 32 are carried out on the data as it is streamed.

Often, FPGA circuits are designed using circuit schematics or a hardware description language (HDL) such as, for example, Verilog. HDLs are used to write synthesisable specifications for FPGA hardware. A simulation program is run which enables simulation of the desired spatial and temporal configuration of the FPGA so that the operation of the FPGA can be modelled accurately before being physically created. HDLs include syntax for expressing parallelism (also known as concurrency) and may include an explicit notion of time.

As an example, FIGS. 4a) and 4b) illustrate graphs defining a simple streaming data path. A graph is a representation of a desired processing operation (e.g. mathematical calculations such as convolutions) to be implemented in hardware as part of a stream processor. The graph represents the processing operation as a parallel structure in the time domain as a function of clock cycles, with data "flowing" along a data path from the input(s) to the output(s) with increasing clock cycle. The data path comprises discrete objects (or nodes) which perform processing operations on the streamed data. The discrete objects correspond directly to hardware elements to be implemented as part of a stream processor on the FPGA. Hardware elements may comprise one or more hardware units (such as CLBs) on the physical FPGA.

FIG. 4a) shows a three input (A, B and C) data path 40 having a single output 42. The data path 40 comprises a pair of nodes 44, 46. In this example, the nodes 44, 46 comprise adders. The nodes 44, 46 are connected between the inputs and output by means of "edges" 48 (or interconnects) between the inputs A, B, C, nodes 44, 46 and output 42.

As shown in FIG. 4a) (and subsequent figures), the nodes 44, 46 and edges 48 define a plurality of branches within the data path 40. In general, a data path represents a particular process operation or function and is implemented as a pipelined circuit through which the data flows. A kernel may also comprise a plurality of branches (also called control paths) which do not compute directly on the data but may configure the data path at different points in time to change its function. These branches may be dependent upon other branches, or may be independent or semi-independent depending upon the nature of the bulk computation performed by a particular data path.

However, whilst for clarity the term data path corresponds to a kernel, it is within the scope of the invention for a data path to be split across more than one kernel. The scope of the terms defined herein will be readily apparent to one skilled in the art.

Expressed as an equation, the desired calculation is:

$$(A+B)+C=\text{Output} \quad \quad 1$$

Therefore, it is desired to add inputs A and B at node 44 before adding the result to input C at node 46. However, this data path 40 will generate incorrect calculations. This is because each node 44, 46 has a particular latency associated therewith, i.e. the processor time it takes the adder 44, 46 to complete the calculation before the result is released to the next stage of the data path 40. In other words, the data propagates through the data path 40 in a lock step manner—each node 44, 46 has a latency associated therewith. In the common case a global clock is distributed to all nodes (running for example at 100 MHz), and the latency of each node is measured in number of clock cycles.

Consequently, once data is inputted simultaneously at inputs A, B and C, data input A and data input B will arrive at adder 44 at the same time as input data C arrives at adder 46. Consequently, adder 46 will attempt to add input data C to no value at all (because the value from adder 44 has yet to arrive), generating an incorrect result. For later clock cycles where adder 46 is able to add two actual data values, then the wrong numbers will still be added because data reaching adder 46 from adder 44 will be one cycle behind the data reaching adder 46 directly from input C.

FIG. 4b) shows the hardware solution to this problem. The solution is to add buffering 50 to the edge 48 between input C and adder 46. This adds a delay of one cycle to the data inputted from input C so that the data from adder 44 (i.e. the product of inputs A and B) arrives at adder 46 at the same time as data from input C.

Therefore, insertion of buffering to create a data path or data stream which functions in a correct temporal manner is a required feature of suitable HDLs. In many cases, the user of the HDL is required to specify appropriate buffering. However, whilst HDLs are able to generate data paths which can then be implemented into hardware on actual FPGAs, less consideration has been paid to the optimisation of the data pathways on FPGAs.

Two known methods for building up a circuit taking latencies into account are As Soon As Possible (ASAP) and As Late As Possible (ALAP). In ASAP, all of the inputs are cycle aligned, i.e. all of the inputs are aligned to the same arbitrary cycle (which may be cycle 0 at the start of a calculation). However, this requirement, together with differing input latencies along different branches of the data path, can lead to a mismatch of the input latencies. Therefore, in such cases, buffering is required as shown in FIG. 4b). Since the memory available for buffering is limited on an FPGA 10, it is often desirable to reduce the amount of buffering required.

In contrast, the ALAP scheme develops the data path starting with the output. Performing the analysis on the above example using ALAP gives the data path 52 shown in FIG. 4c). As shown in FIG. 4c), the input C has now been shifted forward by a latency unit of 1. Therefore, there is no longer a need for a buffer in the edge between Input C and adder 46. Consequently, valuable chip resources such as block memory 26 can be saved by this approach.

However, this approach is only suitable for certain situations. FIG. 4d) shows a data path 54. The data path 54 corresponds to the data path 52 of FIG. 4c); however, in this instance, an additional output 56 is added. As shown, the output 56 is offset by a latency of −1 from the original output, i.e. the result desired at the second output 56 is only that from A+B (i.e. the result from the adder 44) and so there is no need to wait for the adder 46 to perform the calculation (A+B)+C.

However, this data path arrangement cannot be created using ALAP because ALAP requires all outputs to have the same offset. This is because the data paths are created starting with the outputs and so the point where outputs are scheduled must be predetermined. Therefore, to implement the data path 54 shown in FIG. 4d), the circuit shown in FIG. 4e) is required. As shown, an additional buffer 58 is required to ensure that the outputs are all at the same offset. The additional buffer is unnecessary and results in a sub-optimal configuration and excessive and non-beneficial usage of resources.

For the data path 54 shown in FIG. 4d), neither ASAP nor ALAP can schedule this design optimally with minimum use of resources. Therefore, there is a need for an optimised manner of generating optimised data paths for massively pipelined hardware such as can be implemented using FPGAs. The more optimised each data path is within an FPGA, the more data paths can be accommodated for a given FPGA with a fixed amount of block RAM 26. Consequently, the processing power of an FPGA can effectively be boosted by efficient architecture of the data paths formed thereon.

Attempts have been made to address these issues in related systems. "*Synthesis and Optimization of Digital Circuits*", G. De Micheli, McGraw-Hill, 1994 describes scheduling operations in the context of multi cycle architecture. This reference addresses minimising overall latency while spreading operations over a number of cycles.

"*ASC: A Stream Compiler for Computing With FPGAs*" O. Mencer, IEEE Transactions On Computer Aided Design Of Integrated Circuits And Systems 2006, Vol 25; No. 9, pages 1603-161 describes an HDL which uses scheduling in a pipelined architecture. However, no provision is made to optimise the configuration of the FPGA data path layout.

Optimisation of algorithmic descriptions is known in the field of high-level synthesis. High-level synthesis is an automated design process that interprets an algorithmic description of a desired behaviour and creates hardware that implements that behaviour. The starting point is a high-level description in a language such as ANSI C, this is then translated into a control data flow graph (CDFG). Operations in the CDFG are mapped to multiple control steps, and then resources are allocated to execute the operations with the intention of using the same hardware resource to implement different algorithmic operations at different control steps.

Examples of the high-level synthesis approach can be found in: "A Formal Approach to the Scheduling Problem in High Level Synthesis". C. T. Hwand et al, IEEE Transactions on Computer-Aided Design; Vol 10; No 4; 1991; U.S. Pat. No. 7,000,213; U.S. Pat. No. 6,941,541; "Minimizing Buffer Requirements under Rate-Optimal Schedule in Regular Dataflow Networks", R. Govindarajan et al. ACAPS Technical Memo 69, February 1994, MCGill University; "ILP-Based Scheduling with Time and Resource Constraints in High Level Synthesis", S. Chaudhuri and R. Walker, Proc. VLSI Design '94, pp. 17-25; "Rate Optimal VLSI design from data flow graph", Oh et al, submissions for 35$^{th}$ Design Automation Conference, DAC 98; and "Scheduling algorithms for high-level synthesis" Govindarajan, Term Paper, Dept ECECS, University of Cincinnati, Mar. 17, 1995. However, none of the above examples relates to the scheduling of optimised parallel pipelined stream processor hardware designs or their implementation on FPGAs.

As described above, compute units or nodes have a latency which can lead to the data becoming misaligned and mangled unless it is corrected with carefully placed buffering. Although it is straightforward to add buffering to a circuit to balance latencies this is often suboptimal and results in excessive usage of the finite amount of buffering memory provided on a typical FPGA.

Therefore, to date, known schemes and hardware for optimising the data path structure of parallel pipelined hardware such as can be implemented on an FPGA have suffered from the technical problem that they are not able to optimise and fully utilise the available resources of an FPGA by efficient stream scheduling.

According to a first aspect of embodiments of the invention, there is provided a method of generating a hardware design for a pipelined parallel stream processor, the method comprising: defining, on a computing device, a processing operation designating processes to be implemented in hardware as part of said pipelined parallel stream processor; defining, on a computing device, a graph representing said processing operation as a parallel structure in the time domain as a function of clock cycles, said graph comprising at least one data path to be implemented as a hardware design for said pipelined parallel stream processor and comprising a plurality of parallel branches configured to enable data values to be streamed therethrough, the or each data path being represented as comprising at least one input, at least one output, at least one discrete object corresponding directly to a hardware element to be implemented in hardware as part of said pipelined parallel stream processor, the or each discrete object being operable to execute a function for one or more clock cycles and having a predefined latency associated therewith, said predefined latency representing the time required for said hardware element to execute said function, said data values propagating through said data path from the at least one input to the at least one output as a function of increasing clock cycle; defining, on a computing device, the at least one data path and associated latencies of said graph as a set of algebraic linear inequalities; solving, on a computing device, said set of linear inequalities; optimising, on a computing device, the at least one data path in said graph using said solved linear inequalities to produce an optimised graph; and utilising, on a computing device, said optimised graph to define an optimised hardware design for implementation in hardware as said pipelined parallel stream processor.

By providing such a method, the optimisation of a hardware design for a stream processor can be considered as a global optimisation problem in which integer linear programming can be used to produce an optimal solution. This enables the hardware design, when implemented in hardware as a pipelined parallel stream processor, to utilise fully the available resources of the hardware platform. In an embodiment, the latency of each discrete object is known and predefined. This is because the hardware element (comprising one or more hardware units) represented by the discrete object has a known latency. Consequently, in an embodiment, the predefined latency is a fixed latency having a constant value.

In one embodiment, said processing operation comprises a mathematical function or calculation to be implemented in hardware as said pipelined parallel stream processor.

In one embodiment, the or each hardware element comprises one or more hardware units on said pipelined parallel stream processor.

In one embodiment, the or each hardware element is configured to carry out a predetermined mathematical function.

In one embodiment, said step of optimising comprises minimising the amount of buffering required to schedule said data path.

In one embodiment, said step of optimising the data path further comprises: if required, inserting buffering into at least some of the branches of said data path.

In one embodiment, said buffering represents memory units on said pipelined parallel stream processor.

In one embodiment, said buffering is minimised for the entire graph.

In one embodiment, said step of optimising further comprises merging two or more buffers into a single buffer.

In one embodiment, said step of optimising further comprises allocating a single buffer to two or more branches of said at least one data path.

In one embodiment, said graph comprises multiple inputs and multiple outputs, each input and each output being connected to at least one branch of said at least one data path.

In one embodiment, said inputs are not cycle aligned. In one embodiment, said outputs are not cycle aligned.

In one embodiment, said graph comprises multiple parallel data paths to be implemented in hardware as said pipelined parallel stream processor, and said steps of solving and optimising are carried out for each of said multiple parallel data paths.

In one embodiment, the method further comprises providing, on a computing device, at least one stream offset object located at a particular point in the data path, said stream offset object being operable to access, for a particular clock cycle and for said particular point in the data path, data values from a clock cycle different from said particular clock cycle.

In one embodiment, said at least one stream offset object is operable to access data values from a clock cycle before said particular clock cycle.

In one embodiment, said at least one stream offset object is operable to access data values from a clock cycle after said particular clock cycle.

In one embodiment, said at least one stream offset object is operable to access data values from a clock cycle offset from said particular clock cycle by a preselected number of clock cycles.

In one embodiment, said at least one stream offset object is operable to access data values from a clock cycle offset from said particular clock cycle by a number of clock cycles dependent upon a variable.

In one embodiment, the value of said variable is specified after said optimised hardware design has been implemented in hardware as said pipelined parallel stream processor.

In one embodiment, the value of said variable is specified before said processing operation is run on said pipelined parallel stream processor.

According to a second aspect of embodiments of the invention, there is provided a method of generating a hardware design for a stream processor, the method comprising:
defining, on a computing device, a processing operation designating processes to be implemented in hardware as part of said stream processor; defining, on a computing device, a graph representing said processing operation in the time domain as a function of clock cycles, said graph comprising at least one data path to be implemented in hardware as part of said stream processor and configured to enable data to be streamed therethrough, the or each data path comprising at least one input, at least one output and at least one discrete object, said data propagating through said data path from the at least one input to the at least one output as a function of increasing clock cycle; providing, on a computing device, at least one stream offset object located at a particular point in the data path, said stream offset object being operable to access, for a particular clock cycle and for said particular point in the data path, data values from a clock cycle different from said particular clock cycle; optimising, on a computing device, the at least one data path in said graph to produce an optimised graph; and utilising, on a computing device, said optimised graph to define an optimised hardware design for implementation in hardware as said stream processor.

In one embodiment, said at least one stream offset object is operable to access data values from a clock cycle before said particular clock cycle.

In one embodiment, said at least one stream offset object is operable to access data values from a clock cycle after said particular clock cycle.

In one embodiment, said at least one stream offset object is operable to access data values from a clock cycle offset from said particular clock cycle by a preselected number of clock cycles.

In one embodiment, said at least one stream offset object is operable to access data values from a clock cycle offset from said particular clock cycle by a number of clock cycles dependent upon a variable.

In one embodiment, said variable is specified after said optimised hardware design has been implemented in hardware as said stream processor.

In one embodiment, the value of said variable is specified before said processing operation is run on said stream processor.

In one embodiment, the step of optimising further comprises: defining, on a computing device, said at least one data path of said graph as a set of algebraic linear inequalities; solving, on a computing device, said set of linear inequalities; optimising, on a computing device, the at least one data path in said graph using said solved linear inequalities to produce an optimised graph.

In one embodiment, said stream processor is implemented on a Field Programmable Gate Array or an Application Specific Integrated Circuit.

In one embodiment, the method further comprises the step of forming said optimised hardware design on said stream processor such that said stream processor is operable to perform said processing operation.

According to a third aspect of embodiments of the invention, there is provided a Field Programmable Gate Array, an Application Specific Integrated Circuit or programmable logic device, having a design generated using method of the first or second aspects.

According to a fourth aspect of embodiments of the invention, there is provided a system for generating a hardware stream processor design, the system comprising: a processor arranged to execute the method of one of the first or second aspects and to generate a list of instructions for the programming of a programmable logic device having the generated design.

According to a fifth aspect of embodiments of the invention, there is provided a method of making a programmable logic device, comprising: generating a design using the first or second aspects of the method; and programming the logic device to embody the generated design.

According to a sixth aspect of embodiments of the invention, there is provided a computer program arranged, when run on a computer, to execute the steps of the first or second aspects.

According to a seventh aspect of embodiments of the invention, there is provided a computer program according to the sixth aspect stored on a computer-readable medium.

According to an eighth aspect of embodiments of the invention, there is provided a Field Programmable Gate Array, other programmable logic device, or Application Specific Integrated Circuit having a design generated using method of the first or second aspects.

According to a ninth aspect of embodiments of the invention, there is provided a system for generating a hardware stream processor design, the system comprising: a processor arranged to execute the method of the first or second aspects and to generate a list of instructions for the programming of a programmable logic device having the generated design.

According to a tenth aspect of embodiments of the invention, there is provided an accelerator card comprising a Field Programmable Gate Array, an Application Specific Integrated Circuit or programmable logic device according to the third aspect.

According to an eleventh aspect of embodiments of the invention, there is provided a computing device comprising: a central processing unit; a memory; and at least one accelerator card according to the tenth aspect.

According to a twelfth aspect of embodiments of the invention, there is provided a computer program product executable by a programmable processing apparatus, comprising one or more software portions for performing the steps of the first or second aspects.

According to a thirteenth aspect of embodiments of the invention, there is provided a computer usable storage medium having a computer program product according to the twelfth aspect stored thereon.

BRIEF DESCRIPTION OF DRAWINGS

Embodiments of the invention will now be described in detail with reference to the accompanying drawings, in which:

FIG. 11 shows a schematic of a computing apparatus for carrying out an embodiment of a method of the invention;

FIG. 12 shows a flow chart of an embodiment of a method of the invention; and

DETAILED DESCRIPTION

As set out above, stream computing is an efficient way to process large amounts of data with arithmetic hardware. However, the performance of stream computing devices is often limited by chip resources such as block memory 26.

Due to latency of hardware elements such as compute or arithmetic, and the need to hold previous values of a calculation for future calculations, buffering must be inserted. Inefficient usage of buffering will result in excessive consumption of memory on an FPGA 10. This will limit the number of data paths or kernels which can be implemented in an FPGA 10.

However, there are many options for the placement of this buffering. Placing the buffering optimally can be considered to be a global optimisation problem. In this regard, integer linear programming can be used to produce an optimal solution.

As set out above, a graph is a way of describing an algorithm as a parallel structure in the time domain using a data path to represent the desired algorithm. A data path can be represented graphically as a mathematical structure consisting of a group of nodes connected by edges. Nodes represent discrete objects such as arithmetic units or compute units. Edges represent connections between two nodes. In other words, nodes represent operations and edges show where the output of each operation feeds into the input of another.

Both nodes and edges may have attributes; for example nodes may have particular properties such as an associated latency. Additionally, edges may have an associated direction.

A typical FPGA 10 will comprise a number of discrete data paths. The number of data paths on a typical FPGA is typically around 10 or less. However, each data path may comprise a multiplicity of parallel branches which comprise, in total typically $10^2$ to $10^5$ computation elements. This enables massively parallel calculations to be performed. Considering each of these data paths, an optimal solution to the global minimisation of a multiplicity of data paths including data branches on an FPGA is sought.

Figure 5:
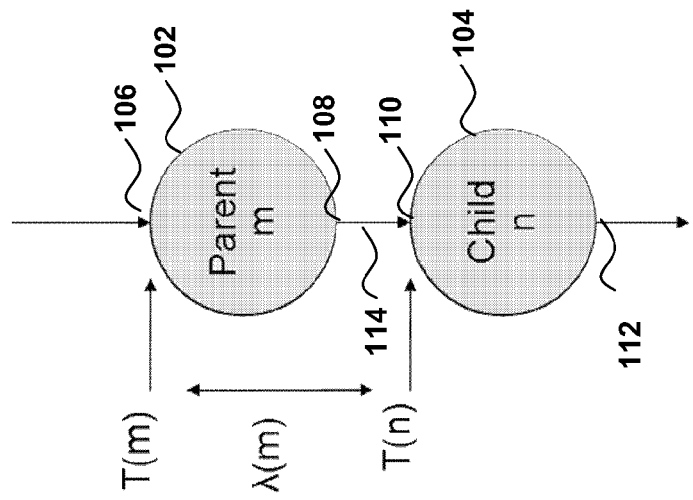
FIG. 5 shows an example of two nodes and associated latencies.
Figure 4E:
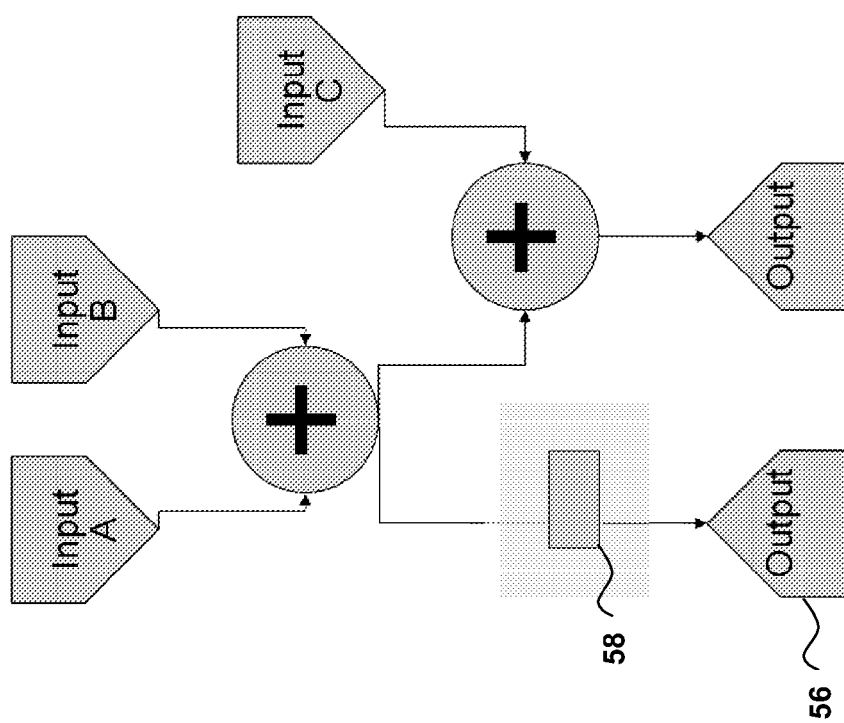
FIG. 4e) shows an example of the data path of FIG. 4d) produced using ALAP techniques.

FIG. 5 shows an underlying principle of an embodiment of the invention. FIG. 5 shows two nodes 102, 104. The node 102 has an input 106 and an output 108. The node 104 has an input 110 and an output 112. The two nodes 102, 104 are connected together by an edge 114. The edge 114 extends between the output 106 of node 102 and the input 110 of node 104.

Node 102 is the "parent" node m and node 104 is the "child" node n. Data arrives at the parent node m 102 at time T(m). Since the node 102 comprises a compute unit, a finite amount of time is required for the computation on received data to be performed. Such a computation may involve LUTs, shift registers or other elements. The time required to perform the calculation is known as the latency of the parent node m 102 and is defined as $\lambda(m)$. The nodes 102, 104 are representative of, and correspond to, one or more hardware units (i.e. CLBs 12) on the FPGA 10 and the latencies thereof correspond to those of the actual hardware.

Therefore, the data will arrive at the input 110 of the child node n 104 at time T(n). T (n) must, therefore, be greater than or equal to the time T(m) that the data arrives at the input 106 of the parent m, plus the latency $\lambda(m)$ of the parent node m 102. The time T (n) will only be equal to T(m) plus $\lambda(m)$ if the edge 114 has zero latency. In the common case, edges do not have a latency since they do not contain any flip-flops and only represent connections between nodes. In the following examples, nodes are described as having latency. However, alternative formulations may be utilised whereby edges are defined as having a latency, or both nodes and edges may have associated latencies.

Additionally, input latencies can also be taken into account by being added to the output latencies, although in these examples all input latencies will be assumed to be zero.

Therefore, where there are N nodes, the arrangement of FIG. 5 can be expressed algebraically as set out in expression 1):

$$\forall (n,m) \cdot \epsilon N \times N \cdot \text{child}(n,m)) \rightarrow T(n) T(m) + \lambda(m) \qquad 1)$$

Figure 1:
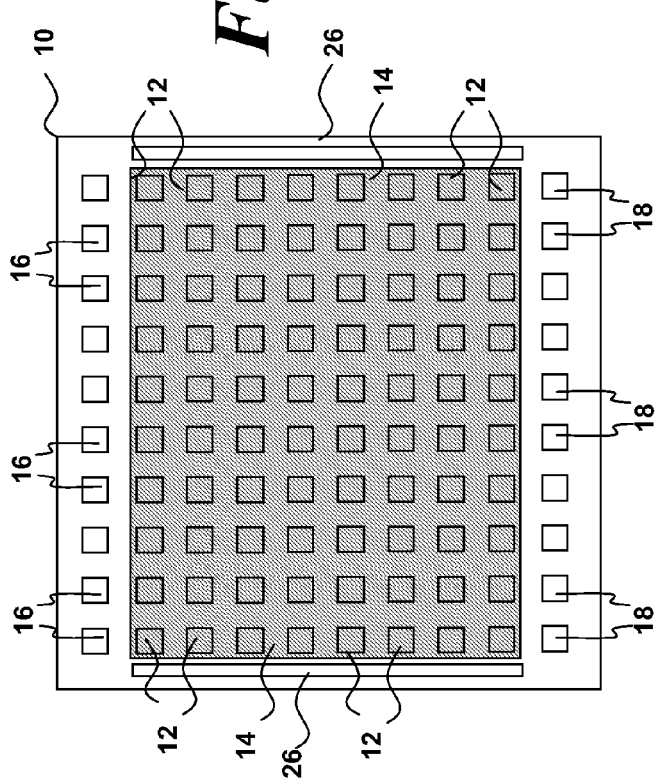
FIG. 1 is a schematic diagram of an FPGA device.
Figure 2:
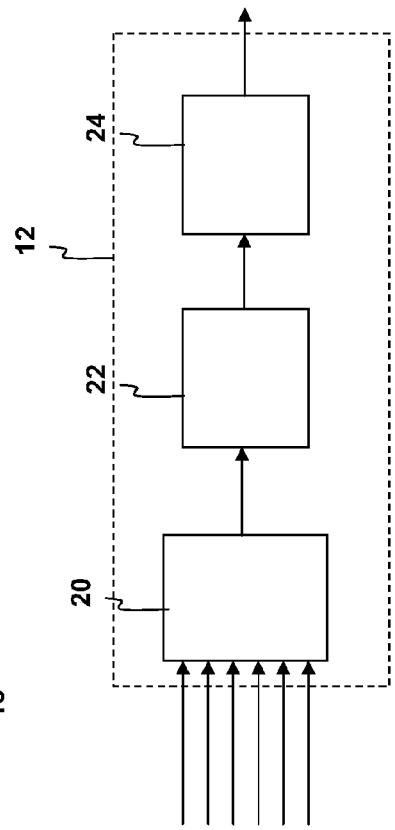
FIG. 2 is a schematic diagram showing a programmable logic block forming part of the FPGA based stream processor of FIG. 1.
Figure 3:
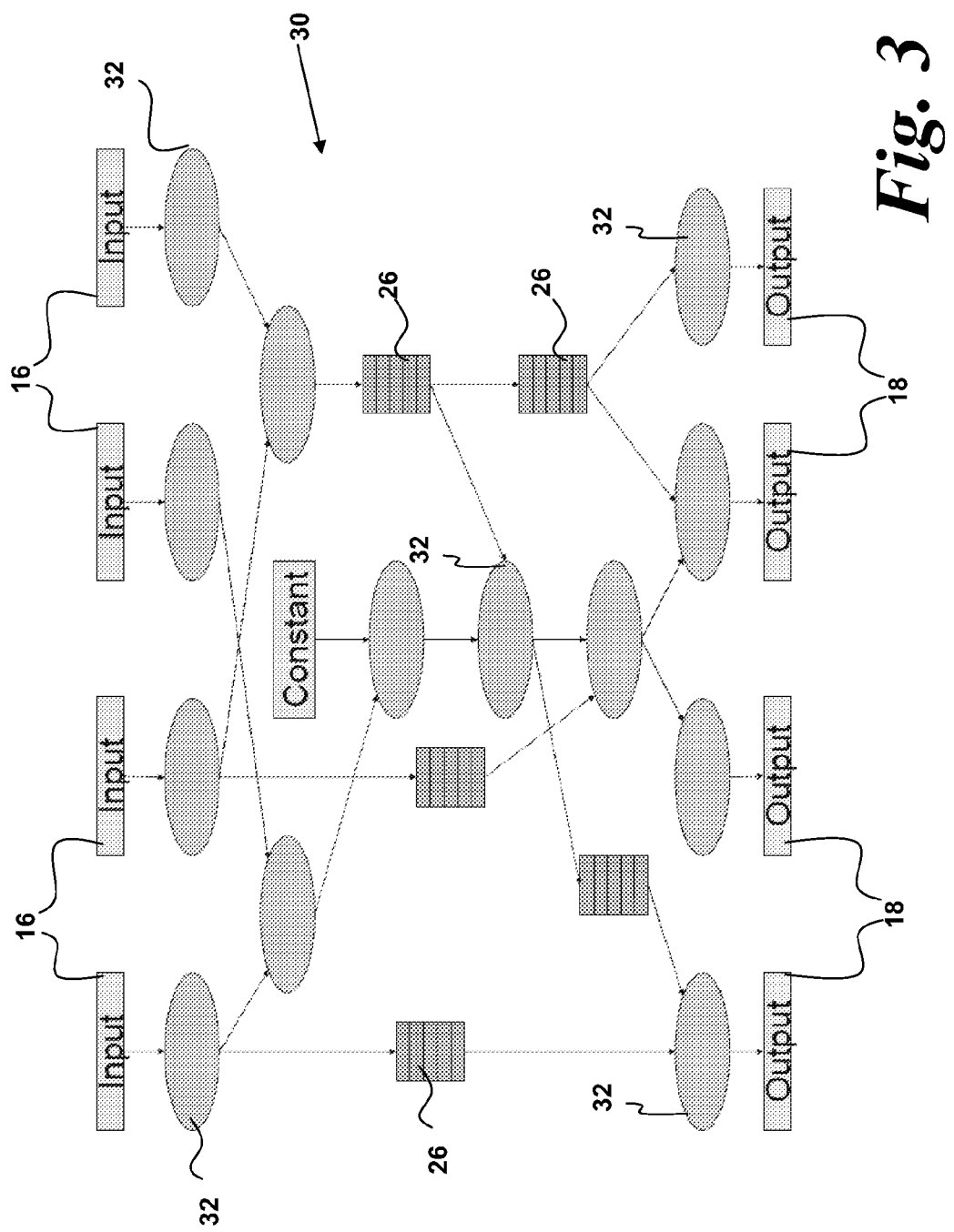
FIG. 3 is a schematic diagram of an example of a possible computation structure for an FPGA-based stream accelerator.
Figure 4B:
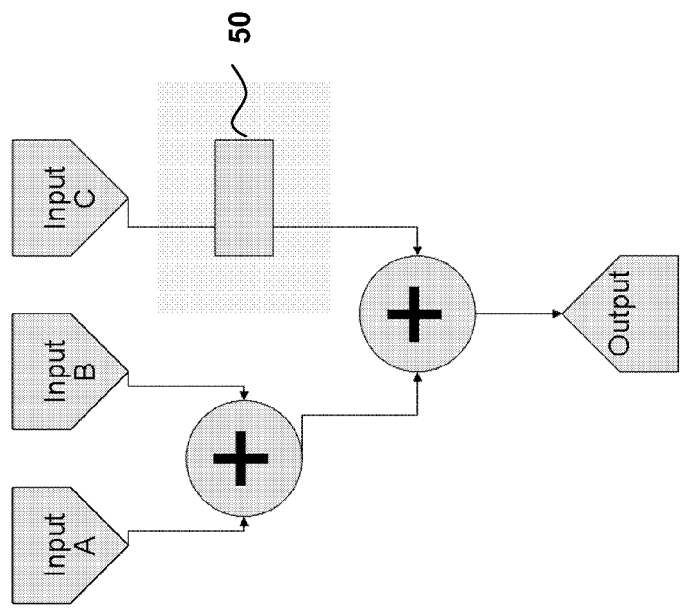
FIG. 4b) shows an example of a simple data path scheduled using ASAP in which buffering is added to ensure correct calculation.
Figure 4A:
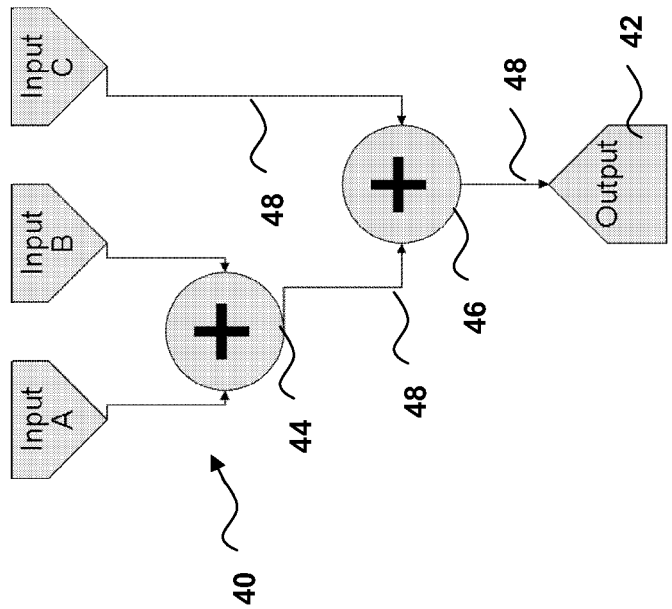
FIG. 4a) shows an example of a graph illustrating a simple data path which will result in generation of errors.
Figure 4D:
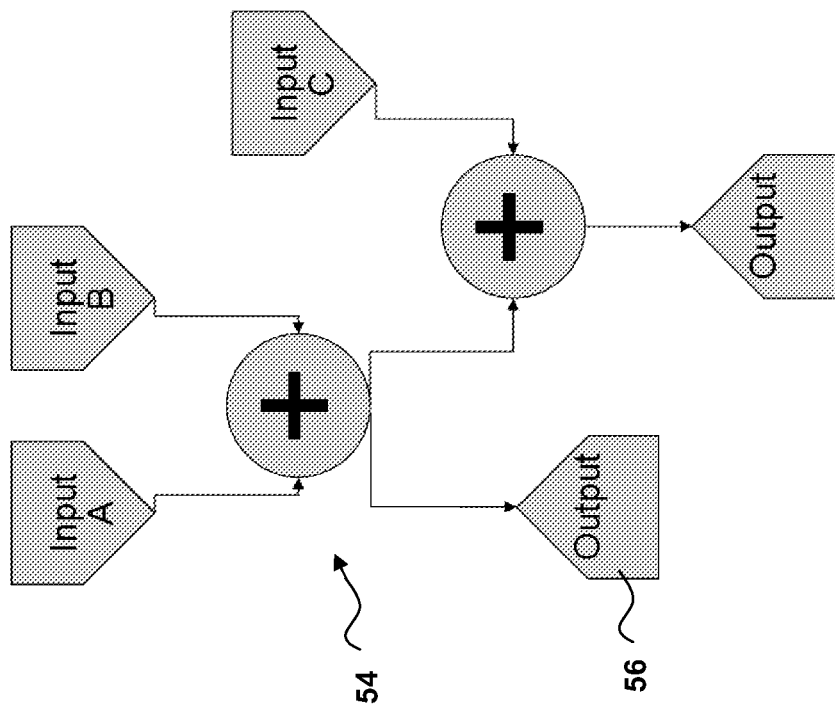
FIG. 4d) shows an example of a desired simple data path comprising two outputs.
Figure 4C:
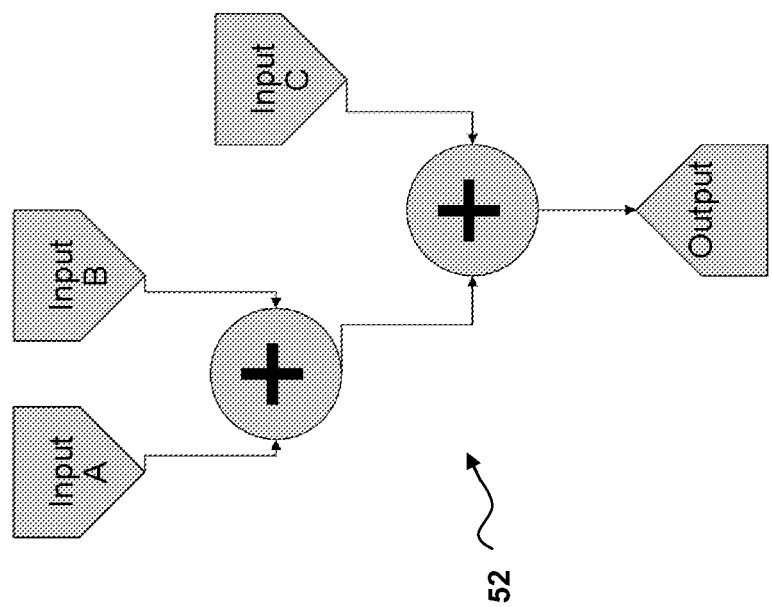
FIG. 4c) shows an example of a simple data path scheduled using ALAP techniques.

Now, taking the example of FIG. 4a), a set of linear inequalities can be produced.

Figure 6:
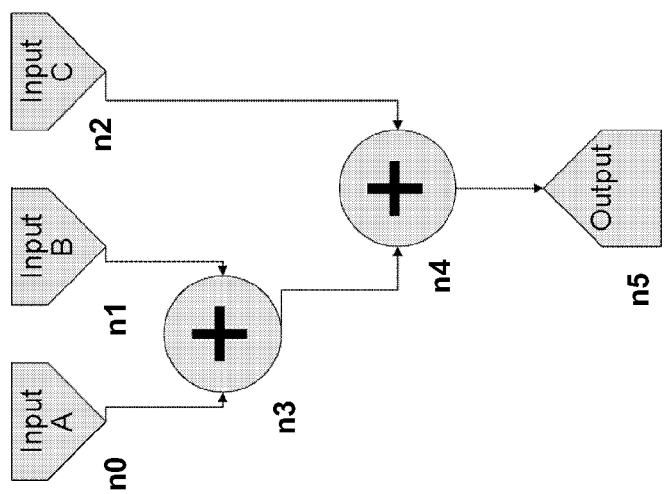
FIG. 6 shows the example of FIG. 4a) with additional notation.

FIG. 6 shows the data path of FIG. 4a) but with additional notation allocating each node a reference between n1 to n5.

Now, as shown in FIG. 6, the data path 40 of FIG. 4a) and FIG. 6 can be expressed as a series of linear constraints, assuming that the addition operations have a latency of 1 cycle, as set out in expression 2):

$$T(n3) \geq T(n0)$$
$$T(n3) \geq T(n1)$$
$$T(n4) \geq T(n3)+1$$
$$T(n4) \geq T(n2)$$
$$T(n5) \geq T(n4)+1 \qquad 2$$

In addition to these linear constraints, we can also formulate a linear expression of the total amount of buffering needed to meet these constraints as set out in expression 3):

$$\forall e \in \text{edges} \rightarrow B(e) = t(e.destnode) - T(e.sourcenode) \qquad 3)$$

$$totalbuffering = \left( \sum_{e \in edges} B(e) \times bitwidth(e) \right)$$

This expression for the total amount of buffering in 3) can be optimally minimised in the presence of the constraints in 2) using an Integer Linear Programming solver, for example, the GNU Linear Programming Kit (GLPK). The result of this minimisation will be a "schedule" of fixed values for T(n) for all nodes in the graph such that total buffering is minimal. As buffering is minimised block memory usage in the FPGA 10 is also minimised. As discussed, block memory usage can often be a limiting factor in FPGA design.

One other important feature of data paths which can be optimised by embodiments of the invention is what is known as "prevs" or previous values. Prevs enable previous values to be used in a calculation e.g. to look 10 cycles back in the stream use a prev of size 10. For example, take the calculation in equation 4):

$$a[i]=a[i]+(a[i-1]+b[i-1]) \qquad 4$$

This can be described as:

$$a=a+(\text{prev}(a)+\text{prev}(b)) \qquad 5$$

Figure 7A:
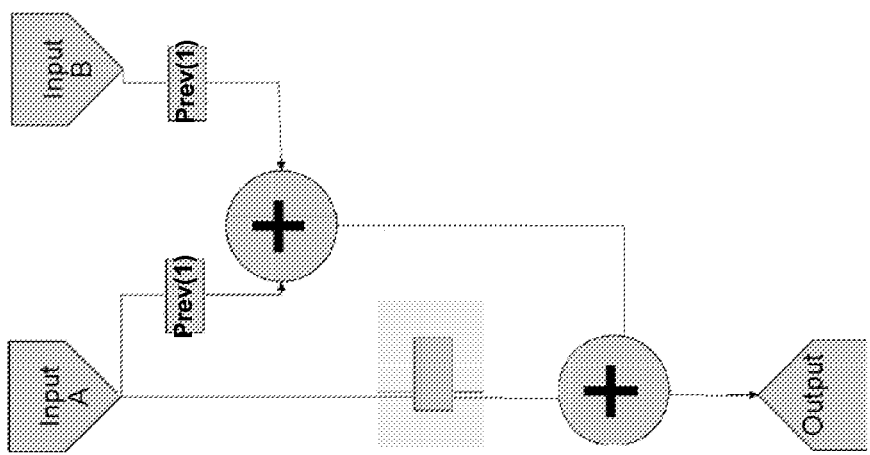
FIG. 7a) shows an example of the use of prevs.

Commonly, prevs are implemented as a buffer with zero latency. The buffer size is the delay that will be introduced on the data, causing a previous value to be presented on the output. This is illustrated in FIG. 7a), implementing equation 5). Therefore, to achieve the above, it is necessary to provide two buffers (labelled prev (1) in FIG. 7a)) with zero latency and, in order to schedule the data path correctly given the latency of the adder nodes, a single buffer of latency 1—making the total buffer count 3.

Figure 7B:
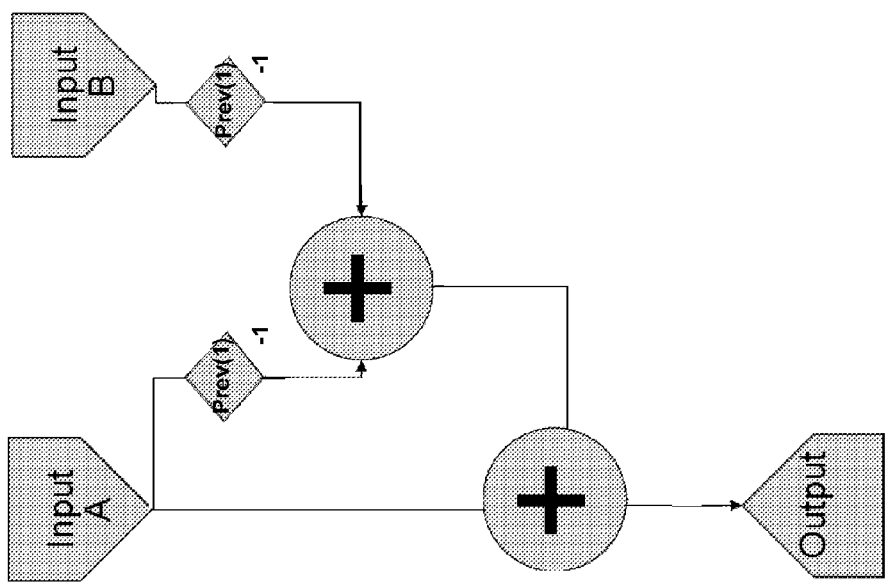
FIG. 7b) shows a further example of the use of prevs.

In contrast, prevs in embodiments of the invention can be defined as stream offsets looking backwards in the stream and are, thus, equivalent to identity nodes with negative latency. Therefore, in embodiments of the invention, the scheduling can be optimised globally and the data path of FIG. 7a) could be replaced by the arrangement of FIG. 7b). As shown, through the use of stream offsets, shown as diamond shaped nodes, this circuit is scheduled and requires zero buffering. This is because the latency of the first adder node has been used to provide the necessary delay for the second adder node and no additional buffering is required as a result.

So, in other words, the use of stream offset nodes produces no hardware directly, but after scheduling the data will be offset by the correct amount in the right places. This is highly efficient because some of the individual latencies can be cancelled out and implementation latencies can be utilised.

A further common type of function is a discard. In the example of the following algebraic expression:

$$\text{Output}=\text{discard}(\text{prev}(a)+a) \qquad 6$$

A circuit implementing the sub-equation prev(a)+a would generate an invalid result on the first cycle because, since the prev function will delay one output by a cycle, on the first cycle only a reaches the adder and not prev(a). Therefore, the first cycle will comprise invalid data. This can be addressed by the use of the discard which simply discards the first (invalid) result and passes the next result to the output. If a prev is a request for a previous value of a data stream, a discard can be thought of as requesting a "future" value.

Thus prevs and discards can both be generalised as stream offsets. Therefore, for a variable a with desired offset n, a prev or discard can be represented as:

$$\text{Prev}(a,n)=\text{streamOffset}(a,-n)$$

$$\text{Discard}(a,n)=\text{streamOffset}(a,n) \qquad 7$$

So, as an example, take equation 8):

$$a[i]=a+a[i+1] \qquad 8$$

Equation 8) can be written under the new formulation as:

$$a=a+\text{streamOffset}(a,+1) \qquad 9$$

As a practical example of the optimisation process, take equation 10):

$$a[i]=a[i-10]+a[i]+a[i+10] \qquad 10$$

This is a common case and can be represented in embodiments of the invention as:

$$a=\text{streamOffset}(a,-10)+a+\text{streamOffset}(a,10) \qquad 11$$

Figure 8A:
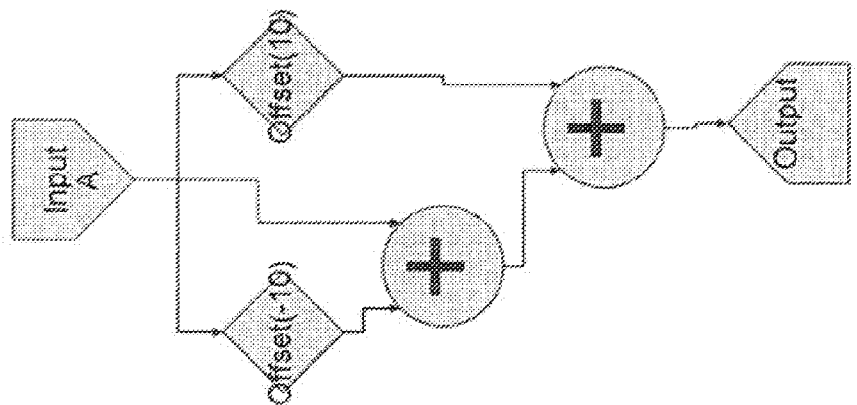
FIGS. 8a) to 8c) show the use of stream offsets.
Figure 8C:
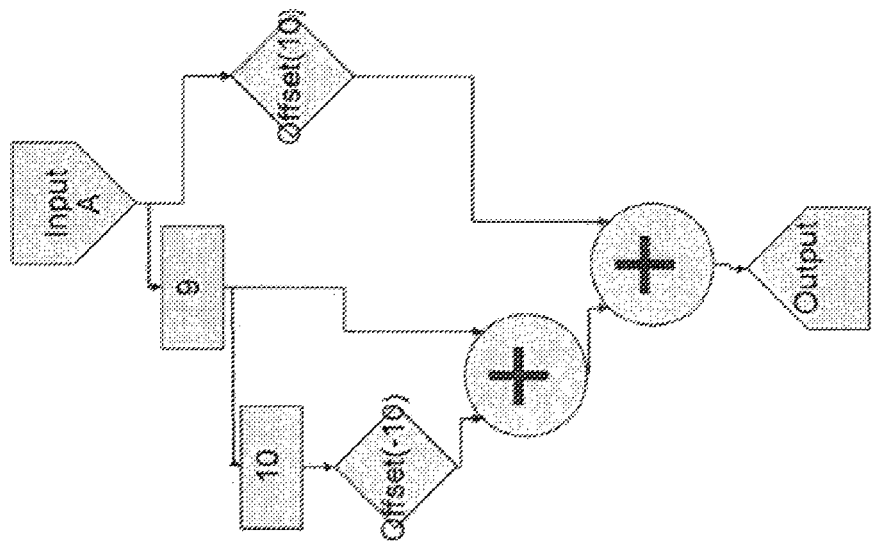
FIG. 8d) shows the use of tapping and folding buffers.
Figure 8B:
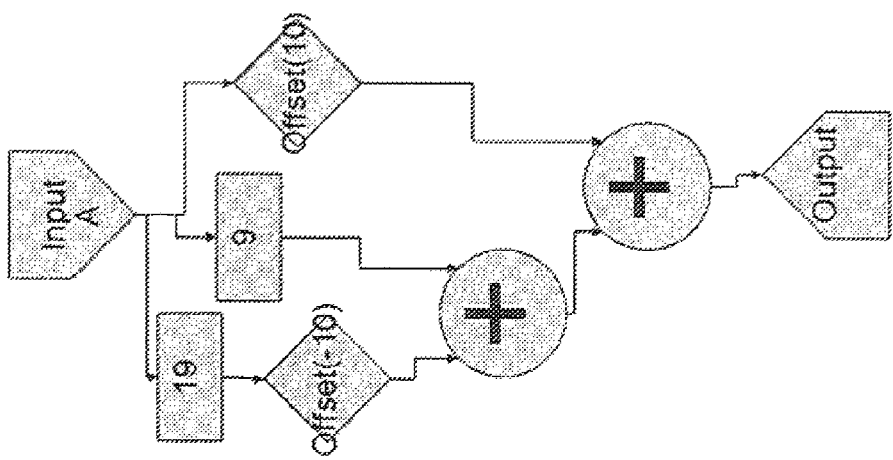

The data path for this is shown in FIG. 8a), and the scheduled data path configuration in FIG. 8b). As shown, a buffering total of 28 is required in this arrangement. Notice that the buffers allocated are of size 19 and 9 rather than 20 and 10, since the 1 cycle latency of the adder has been taken into account.

This buffering can be reduced further through a further process known as tap and fold.

FIG. 8c) shows an example of "tapping". In this example, the separate buffers of 19 and 9 have been replaced by a common buffer of 9 and a further buffer of 10, saving a buffer of 9.

Additionally, FIG. 8 d) shows an example of "folding" where two buffers can be combined into one. This is important since separate buffer allocations may be allocated different memory resources. To explain, block memory is often allocated in units of 18 Kbit or 36 Kbit. When a buffer is allocated, whether the whole of the buffer or only a part thereof is utilised is irrelevant. For a smaller buffer, the access addresses to the buffer change and only a part of the buffer is used. However, the remainder of the buffer is not usable by other data paths. Therefore, being able to "fold" or condense the buffers is important in resource management.

A method of an embodiment of the invention is also operable to handle loops. If feedback is included in a data path pipeline of this type, then a dependency loop is introduced. This presents a problem in a particular pipeline if the data can not complete an entire circuit of the loop in one cycle.

Traditionally, these issues are solved by the insertion of a buffer. This is usually done manually to balance the size of the buffer against the latency of the circuit and schedule the data.

Figure 9:
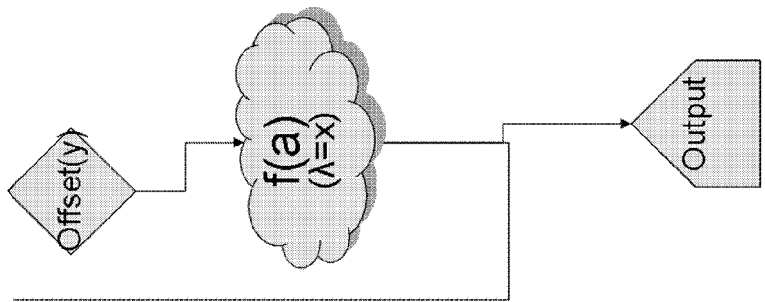
FIG. 9 shows the use of a loop.
Figure 8D:
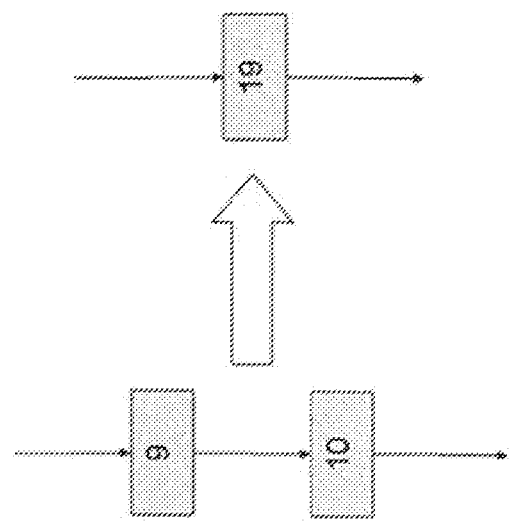

However, considering this problem with the present approach, in order to satisfy the scheduling linear equations, the latency of the whole loop must be zero. This is possible by the insertion of a negative stream offset. If the negative stream offset is large enough, the circuit will give the result expected from the source code. Otherwise, the compilation will fail. However, the failure provides valuable feedback to the user. For example, if the compilation fails, this indicates that the loop is not possible. The manual insertion of a buffer that is required in other methods is eliminated, and the amount of buffer memory required is optimised since the latency of the full loop is considered. An example of a loop formed using an embodiment of the invention is shown in FIG. 9.

In some situations, it is not appropriate to use fixed latencies. Such a situation may arise, for example, in a case where it is desired to access points in a multi-dimensional data set offset by one or more rows, but where the actual size of the data set is not initially known. This is when variable latencies are useful—when using offsets to access points in a two or three dimensional data block with a size unknown when compiling the data paths.

Consider, as an example, a two dimensional block of 100× 100 data points. In this case, to access a point on the previous row an offset of −100 is required. However, if the dimensions of the block are not known when compiling the data path, it is not possible to provide an offset which will select data on different rows.

However, even if the size it not known when compiling, it is possible to describe the block dimensions algebraically as nx×ny. Therefore, to access different rows, an offset of −nx is required. Further, algebraic latencies can be optimised by breaking them down into separate coefficients. These systems can then be solved independently. For example suppose we have algebraic inequalities as set out in expression 12) below:

$$t0 >= t1 + nx + 2nxy + 10$$

$$t1 >= t2 + 3nx + 4nxy + 20$$

$$t2 >= 30 \qquad 12$$

These expressions cannot be solved directly using a linear solver as the values for nx and nxy are not known. To deal with this, we can break them down into a set of separate inequalities in terms only of nx, nxy and the constant part of the expression, respectively, which can be solved. For expression 12) this is done as follows:

$$(\text{for } nx) t0_{nx} >= t1 + 1$$

$$t1_{nx} >= t2 + 3$$

$$t2_{nx} >= 0 \qquad 13$$

$$(\text{for } nxy) t0_{nxy} >= t1 + 2$$

$$t1_{nxy} >= t2 + 4$$

$$t2_{nxy} >= 0 \qquad 14$$

and (for the constant part)

$$t0_c >= t1_c + 10$$

$$t1_c >= t2_c + 20$$

$$t2_c >= 30 \qquad 15$$

Once the inequalities for nx, nxy, and the constant parts have been solved, they can be combined using addition to generate the final "schedule" for the graph as follows:

$$T(n) = T_{nx}(n) + T_{nxy}(n) + T_c(n) \qquad 16$$

Figure 10C:
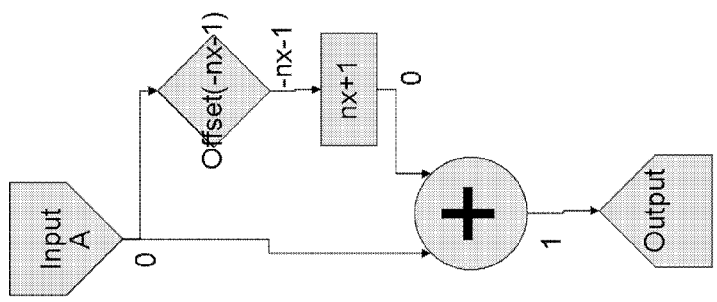
FIGS. 10a) to 10c) show the use of variable offsets and their implementation.
Figure 10B:
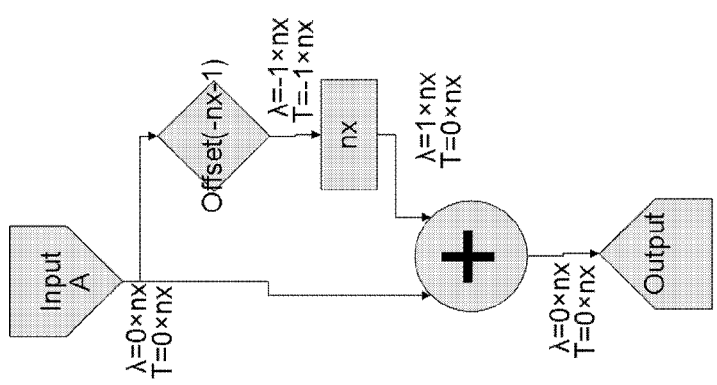
Figure 10A:
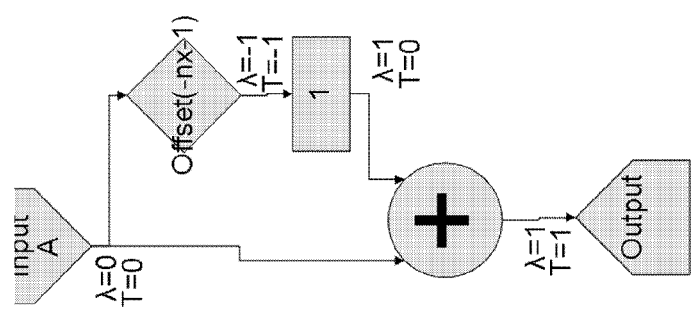

In the case where the variable offset is nx, a schedule for the constants is produced (FIG. 10a), together with the schedule for nx (shown in FIG. 10b) and then combined to give the resultant schedule which is shown in FIG. 10c). Such offsets can be easily implemented in a method of certain embodiments of the invention, to afford greater flexibility to production of FPGA designs where the actual size of the data blocks are unknown when compiling the FPGA (i.e. when implementing the hardware design for the stream processor in the FPGA).

The physical buffer memories on chip can be allocated for the maximum allowable size of nx and if smaller values of nx are required at runtime then only part of the buffer will be utilized. However the generated circuit contains optimally minimal amount of buffering given the specified minimum and maximum values of nx.

An implementation of an embodiment of the invention will now be described with reference to FIGS. 11 and 12.

Step 300: Initialise Library

The method of an embodiment of the invention can be run on a standard computing apparatus 400 or other programmed or programmable apparatus running an operating system such as Windows or Linux.

In this embodiment, the method is implemented as application 402 which utilises a Java library 404. However, other languages may be used and these will be apparent to the skilled person. For example, the application could be run in C, C++ or any other suitable programming language.

The application 402 has a graphical user interface (GUI) 406 which enables a use of the computing apparatus 400 to enter commands and access the application.

At step 300, the application and Java library is initialised. The method then proceeds to step 302.

Step 302: Specify Data Expressions

Through the GUI 406, the user specifies the desired data flow as expressions. These may comprise commands such as add (add(a, b), c). As an example, the user may wish to process a typical 2D cross convolution as defined in expression 18) below. Expression 18) uses, for conciseness, shorthand terminology where:

a*b means mul(a, b) creating a multiply node with two inputs;

a+b means add(a, b) creating an add node with two inputs; and a[b] means streamOffset(a, b) creating a stream offset node with one input and offset of b.

$$o = c*(i[-nx] + i[-1] + i + i[1] + i[nx]) \qquad 18$$

where o is the output, i is the input and nx is the variable size of the fast dimension in the dataset.

Once these commands and expressions have been entered, the method proceeds to step 304.

Step 304: Produce Graph

Once the commands have been entered at step 302, the application 402 utilises the Java library 404 to produce a graph represented by Java objects. Using the example outlined above in expression 18), this will generate a graph such as:

| Node ID | Type | Inputs |
| --- | --- | --- |
| 0 | Input (i) | — |
| 1 | Stream offset (−nx) | 0 |
| 2 | Stream offset (−1) | 0 |
| 3 | Stream offset (1) | 0 |

-continued

| Node ID | Type | Inputs |
|---|---|---|
| 4 | Stream offset (nx) | 0 |
| 5 | Add | 1 2 |
| 6 | Add | 5 0 |
| 7 | Add | 6 3 |
| 8 | Add | 7 4 |
| 9 | Constant (c) | — |
| 10 | Multiply | 9 8 |
| 11 | Output (o) | 10 |

The method then proceeds to step 306.

Step 306: Extract and Process Latency Information

In step 306, the latency information in the graph produced in step 304 is extracted. To take the example illustrated in expression 18), this produces latencies as follows:

| Type | Latency |
|---|---|
| Input | 1 |
| Stream offset (x) | x |
| Add | 1 |
| Constant | 0 |
| Multiply | 10 |

The method then proceeds to step 308.

Step 308: Define Linear Inequalities and Buffering Expressions

From the above definition of the graph as set out in step 302 and associated latencies defined or assumed in step 306, the method then generates a set of linear inequalities defining each of the data paths. Using the example of expression 18) this provides the following combination of constraints and buffering expressions for the constant parts of the latencies for nodes in the graph:

| | |
|---|---|
| T1 >= T0 + 1 | B0 = T1 − T0 − 1 |
| T2 >= T0 + 1 | B0 = T2 − T0 − 1 |
| T3 >= T0 + 1 | B0 = T3 − T0 − 1 |
| T4 >= T0 + 1 | B0 = T4 − T0 + 1 |
| T5 >= T1 | B0 = T6 − T0 − 1 |
| T5 >= T2 − 1 | B1 = T5 − T1 |
| T6 >= T5 + 1 | B2 = T5 − T2 + 1 |
| T6 >= T0 + 1 | B3 = T7 − T3 − 1 |
| T7 >= T6 + 1 | B4 = T8 − T4 |
| T7 >= T3 + 1 | B5 = T6 − T5 − 1 |
| T8 >= T7 + 1 | B6 = T7 − T6 − 1 |
| T8 >= T4 | B7 = T8 − T7 − 1 |
| T10 >= T9 | B8 = T10 − T8 − 1 |
| T10 >= T8 + 1 | B9 = T10 − T9 |
| T11 >= T10 + 10 | B10 = T11 − T10 − 10 |

And the following constraints and buffering expressions for nx:

| | |
|---|---|
| T1 >= T0 | B0 = T1 − T0 |
| T2 >= T0 | B0 = T2 − T0 |
| T3 >= T0 | B0 = T3 − T0 |
| T4 >= T0 | B0 = T4 − T0 |
| T5 >= T1 − 1 | B0 = T6 − T0 |
| T5 >= T2 | B1 = T5 − T1 + 1 |
| T6 >= T5 | B2 = T5 − T2 |
| T6 >= T0 | B3 = T7 − T3 |
| T7 >= T6 | B4 = T8 − T4 − 1 |
| T7 >= T3 | B5 = T6 − T5 |
| T8 >= T7 | B6 = T7 − T6 |
| T8 >= T4 + 1 | B7 = T8 − T7 |
| T10 >= T9 | B8 = T10 − T8 |
| T10 >= T8 | B9 = T10 − T9 |
| T11 >= T10 | B10 = T11 − T10 |

Once the constraints have been set as a group of linear inequalities, the method proceeds to step 310.

Step 310: Solve Linear Inequalities

At step 310, the linear inequalities generated in step 310 are solved. The linear inequalities may be solved by running them through an integer linear programming (ILP) solver. Such a linear system can be solved using, for example, the GNU Linear Programming Kit (GLPK). Thus, taking the example used here, expression 19) below is minimised for both the constants and for nx:

$$B0+B1+B2+B3+B4+B5+B6+B7+B8+B9+B10 \qquad 19$$

The result of the minimisation produces a pipeline schedule as set out below:

| Variable | Constant | nx | Actual time |
|---|---|---|---|
| T0 | 0 | 0 | 0 |
| T1 | 1 | 1 | nx + 1 |
| T2 | 2 | 0 | 2 |
| T3 | 2 | 0 | 2 |
| T4 | 4 | 0 | 4 |
| T5 | 1 | 0 | 1 |
| T6 | 2 | 0 | 2 |
| T7 | 3 | 0 | 3 |
| T8 | 4 | 1 | nx + 4 |
| T9 | 5 | 1 | nx + 5 |
| T10 | 5 | 1 | nx + 5 |
| T11 | 15 | 1 | nx + 15 |

The method then proceeds to step 312.

Step 312: Insert Buffering to Graph

Once the minimised schedule computed in step 310 has been determined, the schedule is applied to the graph through the insertion of buffer nodes to meet the schedule. To use the example defined above, this produces buffering as follows:

| | |
|---|---|
| 0 -> 2 | 1 |
| 0 -> 3 | 1 |
| 0 -> 4 | 3 |
| 1 -> 5 | nx |
| 7 -> 8 | nx |

The method then proceeds to step 314.

Step 314: Optimise Buffering

Various optimisation passes can run on the data paths. This may include tap and fold operations as described previously. A fold operation is where two buffers appear end to end and can be merged into one longer buffer.

As described above, tapping is where two buffers are present coming from the same node output going to different node inputs. In this case, the buffers can be converted to two chained buffers. For example, two buffers length M and N where M>N can be converted into a buffer of length N followed by one of length (M-N). This can save a lot of on chip memory through use of space which would otherwise be wasted.

In the example described above, the 3 buffers coming out of node 0 (total length 5) can be tapped into one buffer of length 1 followed by one buffer of length 2 (total length 3). This value 3 corresponds to the final value of B0.

Once the schedule has been defined, the method proceeds to step 316.

Step 316: Compile Graph

Once the optimised schedule has been determined, the graph can be compiled into a format such that the physical FPGA can then be formed. Compilers and compilation methods are well known in the art and the skilled person would be readily aware of software, hardware and implementations that could be used with embodiments of the invention. The method then proceeds to step 318.

Step 318: Produce FPGA Design

Once the graph has been compiled into the correct format in step 316, the FPGA design for the stream processor is formed. The FPGA design can then, optionally, be used to implement the optimised data paths (or kernels) and data flow in hardware. Once the FPGA design has been formed in hardware on an FPGA chip or device, it can be used as required by the end user to perform the stream calculations defined in step 302.

Figure 13:
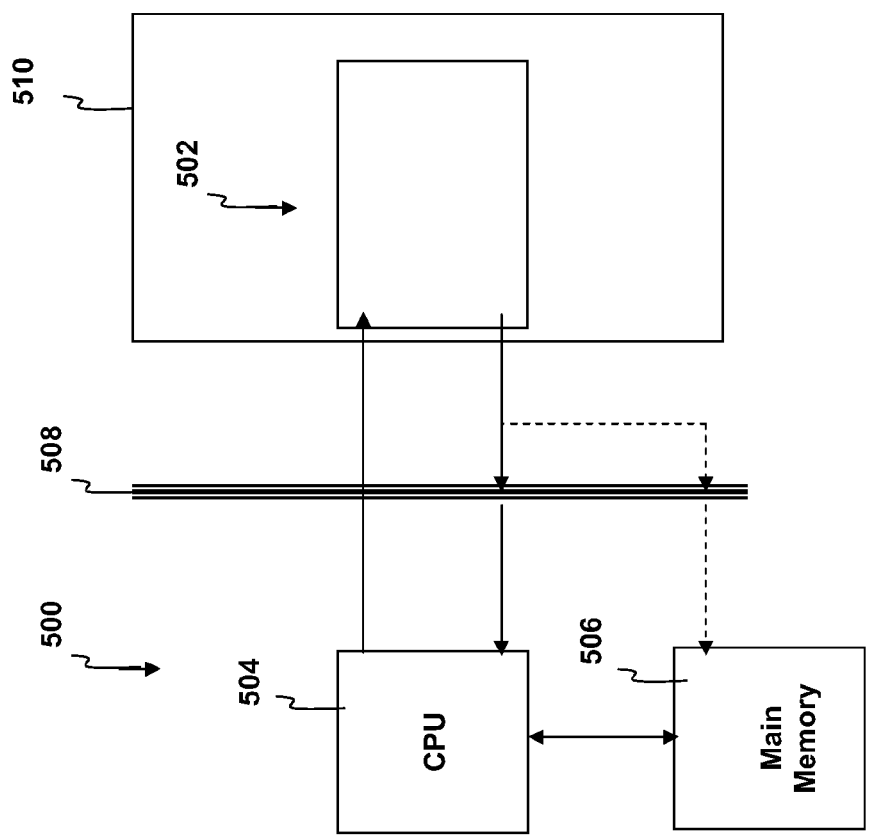
FIG. 13 shows a schematic diagram of a computer apparatus suitable for use with stream processing hardware produced using an embodiment of a method of the invention.

FIG. 13 shows a schematic view of a computing device 500 with which an FPGA design 502 formed using a method of an embodiment of the invention may be used. The computing device 500 comprises a Central Processing Unit (CPU) 504, a main memory 506 and a data bus 508.

The CPU 504 may take any suitable form and comprises a processor for carrying out the instructions of a computer program run on the computing device 500. The CPU 504 is the primary element carrying out the functions of the computing device 500 as is well known in the art. The CPU 504 is commonly located on a motherboard (not shown) which comprises the necessary contacts to supply the CPU 504 with power and to connect the CPU 504 to other components in the computing device 500.

The main memory 506 is associated with the CPU 504 and comprises an area of RAM. The RAM may take the form of SRAM, Dynamic RAM (DRAM) in which bits of data are stored as a charge in a capacitor or transistor gate, or any other suitable memory type. As is common for many computing applications, the main memory 506 may be provided as a plurality of SRAM or DRAM modules. These modules can quickly be replaced should they become damaged or when greater storage capacity is required. The main memory 506 is able to communicate with the CPU 504 via the motherboard forming part of the computing device 500.

The data bus 508 enables additional devices to be connected to the computing device 500 and to communicate with components of the computing device 500. The data bus 508 may take any suitable form, for example a Peripheral Component Interconnect Express (PCI-E) data bus. The data bus 508 acts as a motherboard-level interconnect to link motherboard-mounted peripherals and as an expansion card interface for add-in cards.

The FPGA 502 is located on, in this example, an accelerator card 510. The accelerator card 510 is configured to connect to the data bus 508 and may be, for example, a PCI-E format expansion board comprising interconnects suitable for connecting to a PCI-E data bus.

Whilst, for clarity, only a single accelerator card 510 is included in the following example, it would be readily apparent to the skilled person that additional accelerator cards comprising FPGAs 502 formed according to a method of an embodiment of the invention may be included to provide additional computational power. For example, four accelerator cards 510 may be included in parallel within one system, with each card communicating to the CPU 504 and to each other. Alternatively, multiple FPGA devices 502 may be provided on a single accelerator card 510.

Variations will be apparent to the skilled person. For example, whilst the herein-described examples relate to the generation of hardware designs for FPGA-based stream processors, embodiments of the invention is also applicable to the design of other programmable logic devices or Application Specific Integrated Circuits (ASICs). The skilled person would readily be aware of alternative devices which fall within the scope of the present embodiments.

Embodiments of the invention have been described with particular reference to the examples illustrated. While specific examples are shown in the drawings and are herein described in detail, it should be understood, however, that the drawings and detailed description are not intended to limit the invention to the particular form disclosed. It will be appreciated that variations and modifications may be made to the examples described within the scope of the invention.

The invention claimed is:

1. A method of generating a hardware design for a pipelined parallel stream processor, the method comprising:
    defining, on a computing device, a processing operation designating processes to be implemented in hardware as part of said pipelined parallel stream processor;
    defining, on a computing device, a graph representing said processing operation as a parallel structure in the time domain as a function of clock cycles, said graph comprising at least one data path to be implemented as a hardware design for said pipelined parallel stream processor and comprising a plurality of parallel branches configured to enable data values to be streamed therethrough, the or each data path being represented as comprising at least one input, at least one output, at least one discrete object corresponding directly to a hardware element to be implemented in hardware as part of said pipelined parallel stream processor, the or each discrete object being operable to execute a function for one or more clock cycles and having a predefined latency associated therewith, said predefined latency representing the time required for said hardware element to execute said function, said data values propagating through said data path from the at least one input to the at least one output as a function of increasing clock cycle;
    defining, on a computing device, the at least one data path and associated latencies of said graph as a set of algebraic linear inequalities;
    solving, on a computing device, said set of linear inequalities;
    optimizing, on a computing device, the at least one data path in said graph using said solved linear inequalities to minimize the amount of buffering required to schedule said data path to produce an optimized graph; and
    utilizing, on a computing device, said optimized graph to define an optimized hardware design for implementation in hardware as said pipelined parallel stream processor.

2. The method according to claim 1, wherein said processing operation comprises a mathematical function or calculation to be implemented in hardware as part of said pipelined parallel stream processor.

3. The method according to claim 1, wherein said hardware element comprises one or more hardware units on said pipelined parallel stream processor.

4. The method according to claim 3, wherein said hardware element is configured to carry out a predetermined mathematical function.

5. The method according to claim 1, wherein said step of optimizing the data path further comprises:
if required, inserting buffering into at least some of the branches of said data path.

6. The method according to claim 1 wherein said buffering represents memory units on said pipelined parallel stream processor.

7. The method according to claim 1, wherein said buffering is minimized for the entire graph.

8. The method according to claim 1, wherein said step of optimizing further comprises merging two or more buffers into a single buffer.

9. The method according to claim 1, wherein said step of optimizing further comprises allocating a single buffer to two or more branches of said at least one data path.

10. The method according to claim 1, wherein said graph comprises multiple inputs and multiple outputs, each input and each output being connected to at least one branch of said at least one data path.

11. The method according to claim 10, wherein said inputs are not cycle aligned.

12. The method according to claim 10, wherein said outputs are not cycle aligned.

13. The method according to claim 1, wherein said graph comprises multiple parallel data paths to be implemented in hardware as part of said pipelined parallel stream processor, and said steps of solving and optimizing are carried out for each of said multiple parallel data paths.

14. The method according to claim 1, further comprising providing, on a computing device, at least one stream offset object located at a particular point in the data path, said stream offset object being operable to access, for a particular clock cycle and for said particular point in the data path, data values from a clock cycle different from said particular clock cycle.

15. The method according to claim 14, wherein said at least one stream offset object is operable to access data values from a clock cycle before said particular clock cycle.

16. The method according to claim 14, wherein said at least one stream offset object is operable to access data values from a clock cycle after said particular clock cycle.

17. The method according to claim 14, wherein said at least one stream offset object is operable to access data values from a clock cycle offset from said particular clock cycle by a preselected number of clock cycles.

18. The method according to claim 14, wherein said at least one stream offset object is operable to access data values from a clock cycle offset from said particular clock cycle by a number of clock cycles dependent upon a variable.

19. The method according to claim 18, wherein the value of said variable is specified after said optimizing hardware design has been implemented in hardware as said pipelined parallel stream processor.

20. The method according to claim 19, wherein the value of said variable is specified before said processing operation is run on said pipelined parallel stream processor.

21. The method according to claim 1, wherein said stream processor is implemented on a Field Programmable Gate Array or an Application Specific Integrated Circuit.

22. The method according to claim 1, further comprising the step of forming said optimized hardware design on said stream processor such that said stream processor is operable to perform said processing operation.

23. The method of claim 1, further comprising:
programming a programmable logic device to embody the optimized hardware design.

24. A non-transitory computer-readable medium storing a program arranged, when run on a computer, to:
define processing operation designating processes to be implemented in hardware as part of said pipelined parallel stream processor;
define a graph representing said processing operation as a parallel structure in the time domain as a function of clock cycles, said graph comprising at least one data path to be implemented as a hardware design for said pipelined parallel stream processor and comprising a plurality of parallel branches configured to enable data values to be streamed therethrough, the or each data path being represented as comprising at least one input, at least one output, at least one discrete object corresponding directly to a hardware element to be implemented in hardware as art of said pipelined parallel stream processor, the or each discrete object being operable to execute a function for one or more clock cycles and having a predefined latency associated therewith, said predefined latency representing the time required for said hardware element to execute said function, said data values propagating through said data path from the at least one input to the at least one output as a function of increasing clock cycle;
define the at least one data path and associated latencies of said graph as a set of algebraic linear inequalities;
solve said set of linear inequalities;
optimize the at least one data path in said graph using said solved linear inequalities to minimize the amount of buffering required to schedule said data path to produce an optimized graph; and
utilize said optimized graph to define an optimized hardware design for implementation in hardware as said pipelined parallel stream processor.

25. A Field Programmable Gate Array, Application Specific Integrated Circuit or other programmable logic device, having a design generated by:
defining, on a computing device, a processing operation designating processes to be implemented in hardware as part of said pipelined parallel stream processor;
defining on a computing device, a graph representing said processing operation as a parallel structure in the time domain as a function of clock cycles, said graph comprising at least one data path to be implemented as a hardware design for said pipelined parallel stream processor and comprising a plurality of parallel branches configured to enable data values to be streamed therethrough, the or each data path being represented as comprising at least one input, at least one output, at least one discrete object corresponding directly to hardware element to be implemented in hardware as part of said pipelined parallel stream processor, the or each discrete object being operable to execute a function for one or more clock cycles and having a predefined latency associated therewith, said predefined latency representing the time required for said hardware element to execute said function, said data values propagating through said data path from the at least one input to the at least one output as a function of increasing clock cycle;
defining, on a computing device, the at least one data path and associated latencies of said graph as a set of algebraic linear inequalities;
solving, on a computing device, said set of linear inequalities;
optimizing, on a computing device, the at least one data path in said graph using said solved linear inequalities to minimize the amount of buffering required to schedule said data path to produce an optimized graph; and utilizing, on a computing device, said optimized graph to define an optimized hardware design for implementation in hardware as said pipelined parallel stream processor.

26. A system for generating a hardware stream processor design, the system comprising:

a processor; and a memo coupled to the processor and storing a program that, when executed by the processor, causes the processor to:

define processing operation designating processes to be implemented in hardware as part of said pipelined parallel stream processor;

define a graph representing said processing operation as parallel structure in the time domain as a function of clock cycles, said graph comprising at least one data path to be implemented as a hardware design for said pipelined parallel stream processor and comprising a plurality of parallel branches configured to enable data values to be streamed therethrough, the or each data path being represented as comprising at least one input, at least one output, at least one discrete object corresponding directly to a hardware element to be implemented in hardware as part of said pipelined parallel stream processor, the or each discrete object being operable to execute a function for one or more clock cycles and having a predefined latency associated therewith, said predefined latency representing the time required for said hardware element to execute said function, said data values propagating through said data path from the at least one input to the at least one output as a function of increasing clock cycle;

define the at least one data path and associated latencies of said graph as a set of algebraic linear inequalities;

solve said set of linear inequalities;

optimize the at least one data path in said graph using said solved linear inequalities to minimize the amount of buffering required to schedule said data path to produce an optimized graph; and utilize said optimized graph to define an optimized hardware design for implementation in hardware as said pipelined parallel stream processor; and generate a list of instructions for programming of a programmable logic device having the optimized hardware design.

* * * * *